United States Patent
Jeong et al.

(10) Patent No.: US 7,199,003 B2
(45) Date of Patent: Apr. 3, 2007

(54) METHOD OF MANUFACTURING CAPACITOR OF SEMICONDUCTOR DEVICE BY SIMPLIFYING PROCESS OF FORMING DIELECTRIC LAYER AND APPARATUS THEREFOR

(75) Inventors: Yong-kuk Jeong, Seoul (KR); Myong-geun Yoon, Seoul (KR); Seok-jun Won, Seoul (KR); Dae-jin Kwon, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 40 days.

(21) Appl. No.: 10/696,465

(22) Filed: Oct. 29, 2003

(65) Prior Publication Data
US 2004/0106252 A1 Jun. 3, 2004

(30) Foreign Application Priority Data
Nov. 30, 2002 (KR) ............... 10-2002-0075693

(51) Int. Cl.
*H01L 21/8242* (2006.01)
(52) U.S. Cl. ..................... 438/240; 438/239
(58) Field of Classification Search ........... 438/240, 438/785, 239, 243, 250, 386, 393, 396
See application file for complete search history.

(56) References Cited

U.S. PATENT DOCUMENTS

| | | | |
|---|---|---|---|
| 5,910,218 A | * | 6/1999 | Park et al. .................. 118/719 |
| 6,555,394 B2 | * | 4/2003 | Park et al. ...................... 438/3 |
| 6,673,669 B2 | * | 1/2004 | Basceri et al. .............. 438/240 |
| 6,677,254 B2 | * | 1/2004 | Narwankar et al. ......... 438/785 |
| 6,720,275 B2 | * | 4/2004 | Park et al. ................... 438/785 |
| 6,794,694 B2 | * | 9/2004 | Diodato et al. ............. 257/295 |
| 6,797,560 B2 | * | 9/2004 | Hosoda et al. .............. 438/240 |
| 6,884,675 B2 | * | 4/2005 | Chung et al. ............... 438/240 |
| 6,900,497 B2 | * | 5/2005 | Agarwal et al. ............ 257/306 |

FOREIGN PATENT DOCUMENTS

| | | |
|---|---|---|
| EP | 001020901 A2 * | 7/2000 |
| KR | 2001-0027867 | 4/2001 |
| KR | 10-0331569 | 12/2001 |

* cited by examiner

*Primary Examiner*—Kevin M. Picardat
(74) *Attorney, Agent, or Firm*—Mills & Onello, LLP

(57) ABSTRACT

In a method of manufacturing a capacitor of a semiconductor device and an apparatus therefor, dielectric layers are deposited using only a source gas without a reactant gas and a curing process is performed a single time. As a result, process simplification, yield improvement, and equipment simplification are achieved. In a stand-alone memory or an embedded memory, the step coverage is enhanced and oxidation of a storage node contact plug is prevented. Also, in an analog capacitor, an RF capacitor, or a high-voltage capacitor, which uses thicker dielectric layers than the stand-alone capacitor or the embedded capacitor, the manufacturing process is greatly simplified.

18 Claims, 8 Drawing Sheets

METHOD OF MANUFACTURING CAPACITOR OF SEMICONDUCTOR DEVICE BY SIMPLIFYING PROCESS OF FORMING DIELECTRIC LAYER AND APPARATUS THEREFOR

This application claims the priority of Korean Patent Application No. 2002-75693, filed on Nov. 30, 2002, in the Korean Intellectual Property Office, the disclosure of which is incorporated herein in its entirety by reference.

BACKGROUND OF THE INVENTION

1. Field of the Invention

The present invention relates to methods of manufacturing semiconductor devices and apparatus therefor, and more particularly, to a method of manufacturing a capacitor of a semiconductor device and an apparatus for forming a dielectric layer of the capacitor.

2. Description of the Related Art

According to a conventional method of manufacturing capacitors of semiconductor devices, dielectric layers are deposited using a source gas along with a reactant gas such as $O_2$, $H_2O$, $H_2O_2$, and $N_2O$. Also, as shown in FIG. 1, to improve electrical properties, multiple dielectric layers are deposited (D1, D2, ..., and Dn) between steps of forming a first electrode (1) and a second electrode (2), and multiple curing processes are performed (C1, C2, ..., and Cn) between every two steps of forming dielectric layers.

For example, in the conventional method of forming a dielectric layer of a capacitor used in a stand-alone memory or an embedded memory a deposition process is performed twice and a curing process is performed twice. That is, as shown in FIG. 2, two dielectric layers $DL_1$ and $DL_2$ are formed between two electrodes 15 and 30. Assuming, for convenience, that the thickness of the first dielectric layer $DL_1$ is $St_1$, the thickness of the second dielectric layer $DL_2$ is $St_2$, and the sum of the thicknesses of the two dielectric layers $DL_1$ and $DL_2$ is $t_1(St_1+St_2)$.

Meanwhile, a dielectric layer for an analog capacitor, a radio frequency (RF) capacitor, or a high-voltage capacitor should be formed to a greater thickness than $t_1$ of FIG. 2. Accordingly, deposition processes and curing processes are performed three times or more such that n dielectric layers ($DL_1$, $DL_2$, ..., and $DL_n$) are formed between two electrodes 15 and 30, as shown in FIG. 3. We suppose that the sum of thicknesses of the n dielectric layers ($DL_1$, $DL_2$, ..., and $DL_n$) is $t_2$ ($t_2>t_1$).

FIG. 4 graphically explains the reasons for forming dielectric layers using multiple deposition and curing processes. FIG. 4 is a graph showing the results of forming a $Ta_2O_5$ layer by a twice-performed deposition and a twice-performed curing process for applying to the conventional stand-alone memory and embedded memory.

Squares ■ shown on the graph represents a leakage current density of a capacitor, which uses TiN deposited using physical vapor deposition (PVD) as electrodes. The capacitor is manufactured by depositing a $Ta_2O_5$ layer one time to a thickness of 150 Å through chemical vapor deposition (CVD) using a source gas and an $O_2$ reactant gas. Circle ● represents the leakage current density of a capacitor manufactured by performing a deposition process twice and performing a curing process twice as shown in FIGS. 1 and 2. In this case, TiN deposited using PVD is also employed for electrodes, and a first $Ta_2O_5$ layer is deposited to a thickness of 90 Å by CVD using a source gas and an $O_2$ reactant gas and is then cured using $O_3$. Then, a second $Ta_2O_5$ layer is deposited thereon to a thickness of 60 Å by the same method and is cured using $O_3$ such that the total thickness is 150 Å.

As shown in FIG. 4, when a dielectric layer is formed by performing dual deposition and curing processes (results represented by circles ●), the leakage current density is lowered and electrical properties are markedly improved as compared to the results of the single deposit (results represented by squares ■).

However, if a curing process is carried out following every deposition process of dielectric layers, the manufacturing process becomes complicated, thus reducing yield. Also, because several deposition chambers and several curing chambers are required, the structure of the equipment becomes complicated. Also, in the stand-alone memory and the embedded memory, a storage node contact plug may become oxidized due to a reactant gas such as $O_2$, $H_2O$, $H_2O_2$, and $N_2O$ injected together with the source gas during deposition. Further, in the conventional method, it is difficult to obtain good step coverage. Thus, dielectric layers having poor step coverage cannot be applied to highly integrated semiconductor devices having a narrow interval between storage electrodes (lower electrodes of a capacitor).

SUMMARY OF THE INVENTION

The present invention provides a method of manufacturing a capacitor by simplifying a process of forming a dielectric layer.

The present invention also provides an apparatus which can be used for the method of manufacturing a capacitor according to the present invention.

In accordance with an aspect of the present invention, there is provided a method of manufacturing a capacitor comprising performing reactant-free deposition processes and performing a one-time curing process. Thus, process simplification, yield improvement, and equipment simplification can be achieved.

In one embodiment of the present invention, the method comprises forming a first electrode on a semiconductor substrate and then depositing a first dielectric layer on the first electrode. The first dielectric layer is cured in an atmosphere containing oxygen and a second dielectric layer is then deposited on the cured first dielectric layer using a source gas without a reactant gas. Next, a second electrode is formed on the second dielectric layer without curing the second dielectric layer.

Here, like the second dielectric layer, if the first dielectric layer is deposited using only a source gas without a reactant gas, the resulting electrical properties of the device are improved. The first and second dielectric layers may be deposited using CVD or atomic layer deposition (ALD). To deposit the foregoing layers using only a source gas without a reactant gas, the source gas itself should include oxygen atoms. For example, when $Ta_2O_5$ layers are deposited as the first and second dielectric layers, the source gas may be $Ta(OC_2H_5)_5$ (pentaethoxide tantalum (PET)), tetra ethoxide tantalum-dimethyl amine ethoxide (TET-DMAE), $Ta(OsBu)_5$, $Ta(OC_2H_5)_4(acacC_2H_5)$, $TaCl_2(OC_2H_5)_2$ $C_5H_7O_2$, or $Ta(OCH_3)_5$.

In another embodiment of the present invention, the method comprises forming a first electrode on a semiconductor substrate and then depositing a first $Ta_2O_5$ layer on the first electrode. The first $Ta_2O_5$ layer is cured in an ozone atmosphere, and a second $Ta_2O_5$ layer is then deposited on the cured first $Ta_2O_5$ layer using only a PET source gas without a reactant gas. When the second $Ta_2O_5$ layer is deposited to a predetermined thickness, a second electrode is formed on the second $Ta_2O_5$ layer without an additional curing process.

Preferably, the first $Ta_2O_5$ layer is also deposited using only a PET source gas without a reactant gas, and the first and second $Ta_2O_5$ layers are deposited using CVD.

In accordance with another aspect of the present invention, there is provided an apparatus for manufacturing a dielectric layer, comprising two deposition chambers and a single curing chamber, which are positioned around a transfer chamber. The apparatus comprises a loadlock chamber where a cassette, on which a plurality of semiconductor substrates are loaded, is positioned, a transfer chamber including a robot arm connected to the loadlock chamber for loading/unloading a semiconductor substrate, a first deposition chamber connected to the transfer chamber for depositing a first dielectric layer on the substrate, a curing chamber connected to the first deposition chamber, and a second deposition chamber connected to the transfer chamber for depositing a second dielectric layer on the substrate. Using such an apparatus, a first dielectric layer deposited in the first deposition chamber may be cured in the curing chamber and then a second dielectric layer may be deposited in the second deposition chamber. In this manner, the steps from depositing a first dielectric layer to depositing a second dielectric layer can be carried out in-situ in a single apparatus for forming dielectric layers.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF PREFERRED EMBODIMENTS

Figure 1:
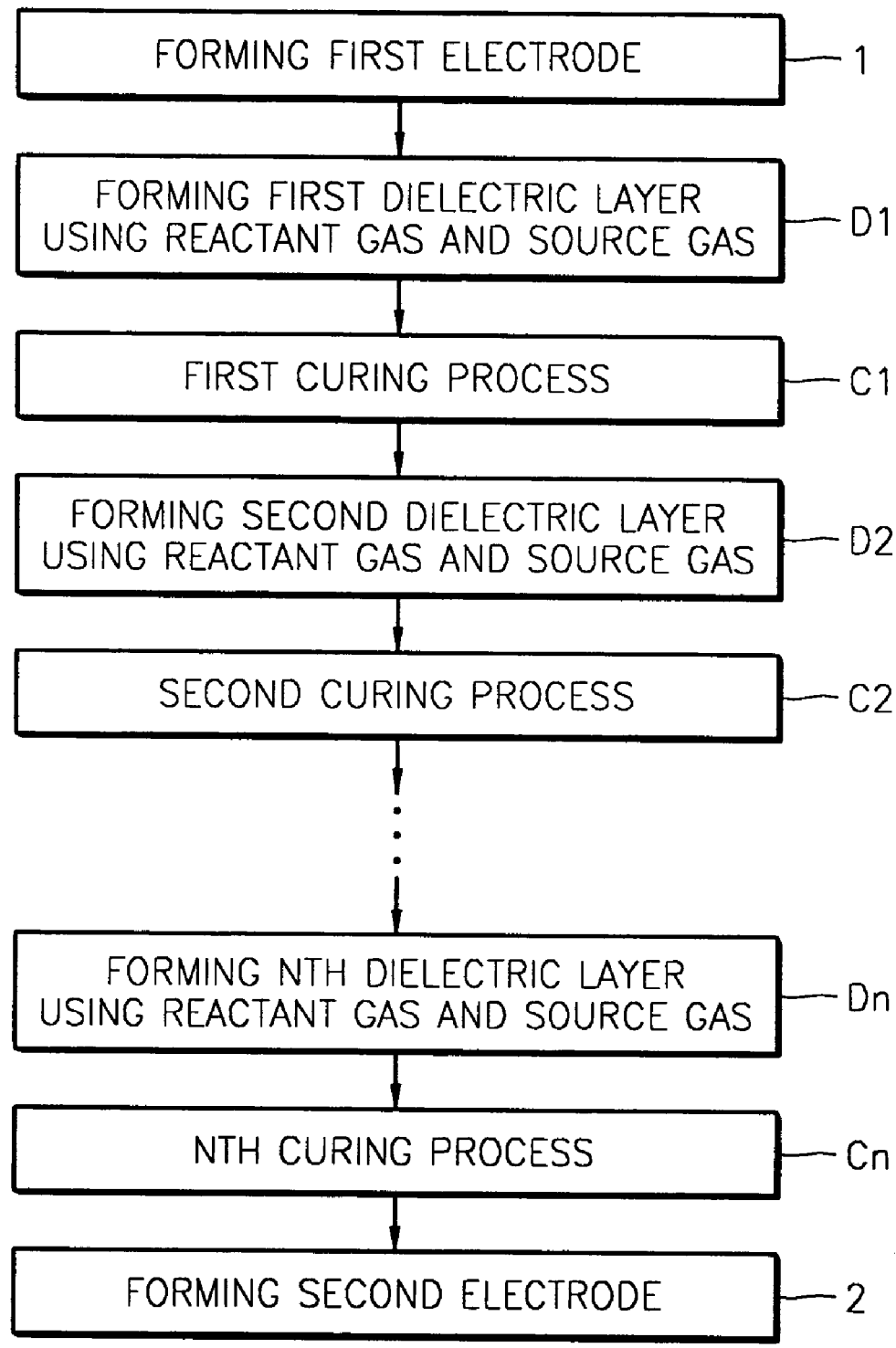
FIG. 1 is a flowchart illustrating a conventional method of manufacturing a capacitor of a semiconductor device.

Hereinafter, embodiments of a method of manufacturing a capacitor by simplifying the process of forming a dielectric layer according to the present invention will be described. This invention may, however, be embodied in many different forms and should not be construed as being limited to the embodiments set forth herein. Rather, these embodiments are provided so that this disclosure is thorough and complete and fully conveys the concept of the invention to those skilled in the art. To facilitate understanding, identical reference numerals have been used, where possible, to designate identical elements that are common to the figures.

Embodiment 1

Figure 2:
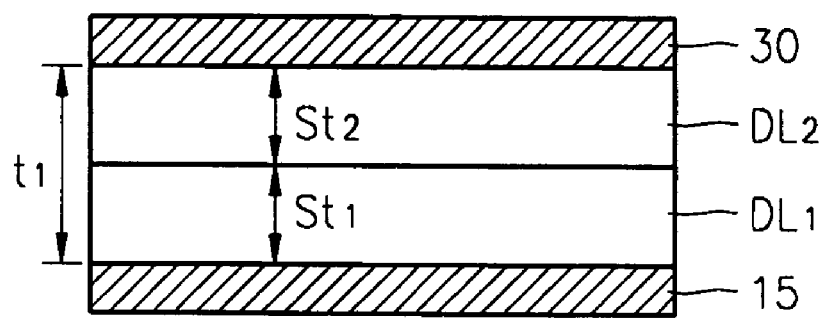
FIG. 2 is a cross-sectional view of a conventional capacitor according to the method of FIG. 1 for applying, for example, to a stand-alone memory or an embedded memory.
Figure 5:
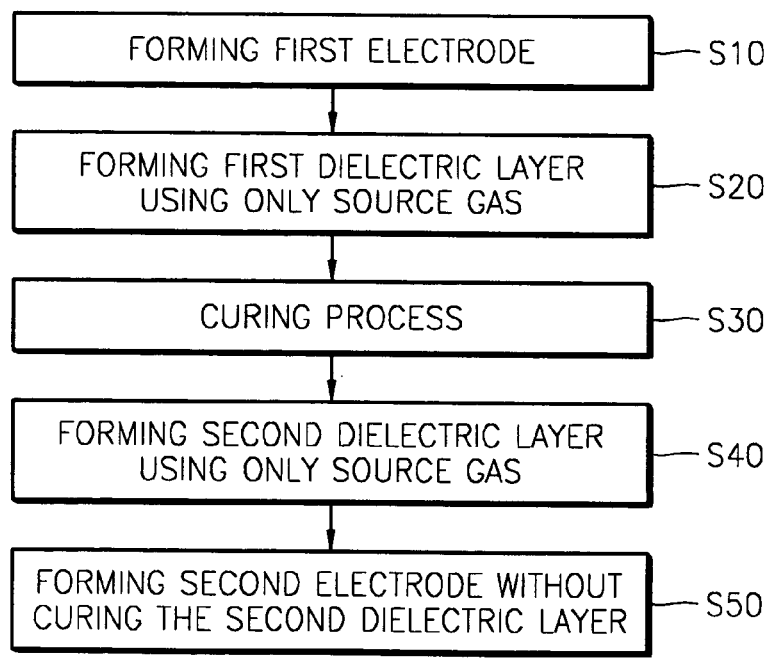
FIG. 5 is a flowchart illustrating a method of manufacturing a capacitor of a semiconductor device according to embodiments of the present invention.
Figure 6:
FIGS. 6 and 7 are cross-sectional views of a capacitor according to the method of FIG. 5, for applying to a stand-alone memory or an embedded memory in accordance with a first embodiment of the present invention.
Figure 7:
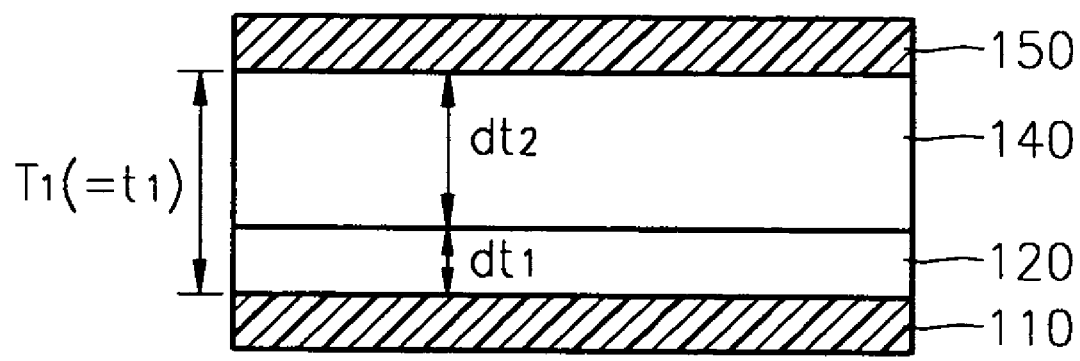

Referring to FIGS. 1 and 2, a conventional dielectric layer of a capacitor, used in a stand-alone memory or an embedded memory, is formed by performing a curing process following each deposition process. However, according to the present invention, a dielectric layer can be simply formed by performing a deposition process twice and performing a single, one-time curing process. FIG. 5 is a flowchart illustrating the method according to the present invention, and FIGS. 6 and 7 are cross-sectional views illustrating respective steps thereof.

The method of manufacturing a capacitor of a semiconductor device according to the present invention will be described hereinafter with reference to FIGS. 5 through 7. Referring to FIGS. 5 and 6, a first electrode 110 is formed on a semiconductor substrate (not shown) in Step S10. A first dielectric layer 120 is deposited on the first electrode 110 in Step S20. Here, only a source gas is used, without a reactant gas. In Step S30, the first dielectric layer 120 is cured (130) in an atmosphere containing oxygen such as $O_3$, $O_2$, $O_2$ plasma, or $N_2O$ plasma. Next, referring to FIGS. 5 and 7, a second dielectric layer 140 is deposited using only a source gas, without a reactant gas, in Step S40. As shown in Step S50, a second electrode 150 is directly formed on the second dielectric layer 140 without any additional curing process.

Here, the first and second electrodes 110 and 150 can be formed of one of TiN, TaN, W, WN, Al, Cu, Ru, $RuO_2$, Pt, Ir, $IrO_2$, a doped polysilicon, and a combination thereof. Also, the first and second electrodes 110 and 150 can be formed using CVD, PVD, or ALD at a temperature of 25 to 1000° C. However, in the case where the first and second electrodes 110 and 150 are deposited using a doped polysilicon, a pre-treatment layer, such as a silicon oxide layer, a silicon nitride layer, and a silicon oxynitride layer, is preferably further formed so as to prevent a reaction with the first and second dielectric layers 120 and 140 and diffusion thereof. The pre-treatment layer may be formed using rapid thermal oxidation (RTO), rapid thermal nitridation (RTN), or CVD. In particular, the first electrode 110 may be formed as not only a stack, as shown in the drawings, but also a three-dimensional fin, trench, or cylinder.

The first dielectric layer 120 may be formed of one of $Ta_2O_5$, $HfO_2$, $ZrO_2$, $Al_2O_3$, $TiO_2$ and a combination thereof. The first dielectric layer 120 is formed by CVD or ALD, using only a source gas without a reactant gas such as $O_2$, $H_2O$, $H_2O_2$, and $N_2O$. Since the reactant gas is not used, the source gas should include oxygen atoms so as to deposit the foregoing dielectric oxide layer. The first dielectric layer 120 is deposited, for example, to a thickness $dt_1$ of 5 to 200 Å at a temperature of 100 to 600° C.

In the present invention, there are various examples of the source gas, which enables reactant-free deposition of the dielectric layer. For example, to deposit a $Ta_2O_5$ layer, a source gas may be $Ta(OC_2H_5)_5$ (pentaethoxide tantalum (PET)), tetra ethoxide tantalum-dimethyl amine ethoxide (TET-DMAE), $Ta(OsBu)_5$, $Ta(OC_2H_5)_4(acacC_2H_5)$, $TaCl_2(OC_2H_5)_2C_5H_7O_2$, or $Ta(OCH_3)_5$. To deposit an $HfO_2$ layer, the source gas may be, for example, $Hf(OtBu)_4$ or $Hf(MMP)_4$, and an $Al_2O_3$ layer may be deposited using a source gas such as $Al(MMP)_3$, $Al(OiPr)_3$, $Al(acac)_3$, or $Al(O_2C(H)EtnBu)_3$. Also, the source gas may be $Zr(OtBu)_4$, $Zr(MMP)_4$, $Zr(METHD)_4$, $Zr(THD)_4$, or $Zr(MTHD)_4$ to deposit a $ZrO_2$ layer, and $Ti(OC_2H_5)_4$, $Ti(MPD)(THD)_2$, $Ti(MPD)(METHD)_2$, $Ti(THD)_2(OiPr)_2$, $Ti(OiPr)_4$, $Ti(MMP)_4$, or $Ti(NPEB)_4$ may be used as a source gas to deposit a $TiO_2$ layer. Here, acac represents acetyl acetone ($CH_3COCH_2COCH_3$), MMP represents 1-methoxy-2-methyl-2-propoxide, and OiPr represents isopropoxy. METHD is indicative of 1-(2-methoxyethoxy)-2,2,6,6-tetramethyl-3,5-heptanedionate, THD is indicative of 2,2,6,6-tetramethyl-3,5-heptanedionate, and MTHD is indicative of 1-methoxy-tetramethyl-3,5-heptanedionate. Also, MPD is indicative of 2-methyl-2,4-pentanedioxide and NPEB is indicative of 1-n-propoxy-2-ethyl-2-butoxide.

Generally, depositing a thin oxide layer using CVD comprises injecting a source gas into a deposition chamber together with a reactant gas such as $O_2$, $H_2O$, $H_2O_2$, and $N_2O$, and then heating the semiconductor substrate. Thus, oxides are deposited using thermal decomposition and reaction between gases that occur on the semiconductor substrate. Also, depositing a thin oxide layer using ALD comprises supplying a source gas to a deposition chamber and physically and chemically adsorbing the source gas on a semiconductor substrate. Then, the redundant source gas and the physisorbed source gas are purged using a purge gas such as $N_2$. Next, a reactant gas such as $O_2$, $H_2O$, $H_2O_2$, and $N_2O$ is supplied to the deposition chamber and reacts with the chemisorbed source gas. The redundant reactant gas is also purged using a purge gas. The foregoing steps are repeatedly performed until the thin oxide layer having a predetermined thickness is obtained.

Meanwhile, according to the present invention, a dielectric oxide layer may be deposited using only a source gas without a reactant gas such as $O_2$, $H_2O$, $H_2O_2$, and $N_2O$. By using the source gas including oxygen atoms, the thin dielectric oxide layer can be obtained without the reactant gas. For example, depositing the dielectric oxide layer using CVD comprises introducing a semiconductor substrate into a deposition chamber, supplying a source gas including oxygen atoms to the deposition chamber, and then heating the semiconductor substrate. Thus, the source gas is thermally decomposed on the semiconductor substrate so as to deposit a stable dielectric oxide layer.

Also, in the present invention, depositing a dielectric oxide layer using ALD comprises introducing a semiconductor substrate into a deposition chamber and injecting a source gas including oxygen atoms into the deposition chamber so as to induce chemical and physical adsorption. Here, the source gas is supplied using a bubbler technique or a liquid delivery system (LDS) technique. Once the adsorption is complete, after a predetermined time, an $N_2$ or Ar inert gas is injected into the deposition chamber so as to remove the redundant source gas other than the chemisorbed source gas from the deposition chamber. When the semiconductor substrate is heated, the adsorbed source gas is thermally decomposed to deposit a stable dielectric oxide layer. After a predetermined time, the inside of the deposition chamber is purged using a purge gas so as to remove the residual materials resulting from the reaction. Next, a cycle of injecting a source gas, injecting a purge gas, reaction, and injecting a purge gas is repeated until the dielectric oxide layer having a predetermined thickness is formed.

The first dielectric layer 120 is cured (130) in an atmosphere containing oxygen, for example, an ozone or oxygen atmosphere, or using $O_2$ plasma or $N_2O$ plasma. The plasma may be an RF plasma of 13.56 MHz or electron cyclotron resonance (ECR). Oxygen atoms generated from an atmosphere containing oxygen penetrate into the dielectric layer and are bonded with a dangling bond. As a result, the curing process 130 enables the first dielectric layer 120 to exhibit stable characteristics and oxygen vacancy to be filled, thus improving electrical properties. The temperature of the curing process 130 may be decided considering the type and the thickness of the deposited first dielectric layer 120 or other process conditions. Generally, the curing process 130 is carried out at a low temperature of approximately 350 to 650° C.

The second dielectric layer 140 is also deposited using only a source gas, without a reactant gas, by the same method as the first dielectric layer 120. The second dielectric layer 140 may be formed, for example, of one of $Ta_2O_5$, $HfO_2$, $ZrO_2$, $Al_2O_3$, $TiO_2$, and a combination thereof using CVD or ALD. The second dielectric layer is deposited at a temperature of 100 to 600° C., like the first dielectric layer 120, while the deposited thickness $dt_2$ ranges from 5 to 3000 Å. Examples of the source gas are the same as those of the first dielectric layer 120.

The thickness $dt_2$ of the second dielectric layer 140 should be greater than that $dt_1$ of the first dielectric layer 120 considering the step coverage and facility of the curing process. However, considering the electrical properties of the resulting device, the preferable thickness $dt_1$ of the first dielectric layer 120 may optionally be greater than that $dt_2$ of the second dielectric layer 140. The thicknesses $dt_1$ and $dt_2$ should be decided with all considerations for the step coverage, the facility of the curing process, and the electrical properties.

In the present embodiment, the thickness $dt_1$ may be thinner than that $St_1$ of FIG. 2 and the thickness $dt_2$ may be thicker than that $St_2$ of FIG. 2, so that the thickness $T_1$ of the entire dielectric layer, i.e., the sum of the thicknesses $dt_1$ and $dt_2$ of the first and second dielectric layers 120 and 140, can be maintained to be equal to the thickness $t_1$ of the dielectric layer of FIG. 2. Because the entire dielectric layer can be formed to a desired thickness by forming the first dielectric layer to be thinner than $St_1$ of FIG. 2, even if the dielectric layer is deposited on a first electrode having a relatively complicated structure, the step coverage can be improved and yield can be increased. Also, since the dielectric layer is deposited using only a source gas, without a reactant gas such as $O_2$, $H_2O$, $H_2O_2$, and $N_2O$, oxidation of a storage node contact plug caused by the reactant gas can be suppressed. The foregoing advantages will be explained in detail through the following embodiments.

Embodiment 2

Figure 8:
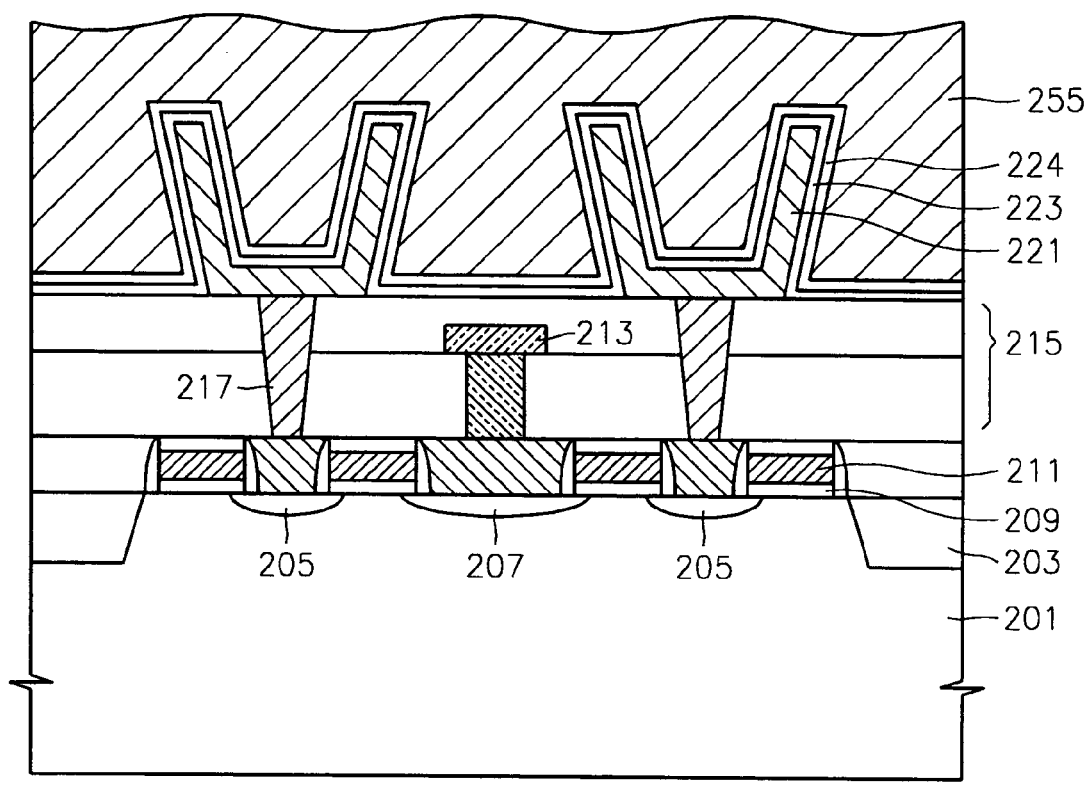
FIG. 8 illustrates the present invention applied to the formation of a DRAM capacitor in accordance with a second embodiment of the present invention.

FIG. 8 illustrates the first embodiment of present invention, with reference to FIGS. 5 through 7, as applied to the formation of a DRAM capacitor.

Specifically, a transistor is formed at an active region of a semiconductor substrate 201, which is defined by shallow trench isolation 203. The transistor includes a source region 205, a drain region 207, and a gate electrode 211 with an intervening gate oxide layer 209. Also, a bit line 213 is connected to the drain region 207, while a storage electrode, i.e., a first electrode 221, is connected to the source region 209 through a storage node contact plug 217 that fills a contact hole formed in an interlayer dielectric (ILD) 215. As described above, the first electrode 221 has the three-dimensional cylinder shape. The first electrode 221 is formed of one of TiN, TaN, W, WN, Al, Cu, Ru, $RuO_2$, Pt, Ir, $IrO_2$, a doped polysilicon, and a combination thereof. Also, the first electrode 221 can be formed using CVD, PVD, or ALD at a temperature of 25 to 1000° C. Next, a cleaning process is carried out to stabilize the interface of the first electrode 221, and then dielectric layers 223 and 224 and a second electrode 225 are formed on the first electrode 221.

As described above, the dielectric layers 223 and 224 are deposited using CVD or ALD using only a source gas without a reactant gas. The first dielectric layer 223 is deposited to a relatively thin thickness and is then cured using $O_3$. Next, the second dielectric layer 224 is deposited to provide a predetermined combined dielectric layer thickness, without performing an additional curing process.

For example, assuming the temperature of the semiconductor substrate 201 is 430° C. and the pressure of the chamber is 1 Torr, the thickness of the first dielectric layer 223 is 90 Å and a thickness of the second dielectric layer 224 is 60 Å such that the total thickness is 150 Å. The first dielectric layer 223 is cured using $O_3$ at 400° C. with 30 Torr for five minutes. The second electrode 225 is formed by the same method as the first electrode 221. The preferable composition of the first electrode 221/dielectric layers 223 and 224/second electrode 225 is TiN/$Ta_2O_5$/TiN, between which reactivity is so low as to prevent degradation of the capacitor.

After forming the first dielectric layer 223, the second dielectric layer 224 is formed to meet the remaining required thickness. In this manner, the first electrode 221 having a complicated cylinder structure, as shown in FIG. 8, is able to satisfy the requirement for improved step coverage. Also, because the dielectric layers 223 and 224 are deposited using only a source gas such as PET containing oxygen atoms, without a reactant gas such as $O_2$, $H_2O$, $H_2O_2$, and $N_2O$, oxidation of the storage node contact plug 217 can be prevented.

Embodiment 3

As described above, an analog capacitor, an RF capacitor, or a high-voltage capacitor requires a thicker dielectric layer than a capacitor used in a stand-alone memory or embedded memory. Therefore, according to the conventional method, the dielectric layer was formed by performing repeated deposition curing processes. However, according to the present invention, even a relatively thick dielectric layer can be formed through a twice-performed deposition process and a one-time curing process. This is described hereinafter with reference to the flowchart of FIG. 5 and the cross-sectional view of FIG. 9.

Figure 9:
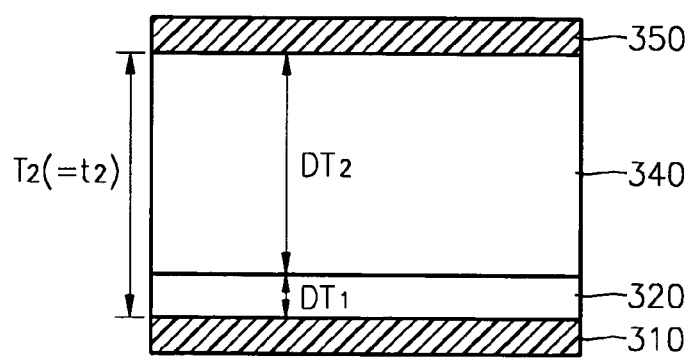
FIG. 9 is a cross-sectional view of a capacitor according to the method of FIG. 5, for applying to an analog capacitor, an RF capacitor, or a high-voltage capacitor, in accordance with a third embodiment of the present invention.

Referring to FIG. 9, a first dielectric layer 320 and a second dielectric layer 340 are formed between a first electrode 310 and a second electrode 350. As mentioned above, the first and second dielectric layers 320 and 340 are deposited using only a source gas, without a reactant gas. The first dielectric layer 320 is cured in an atmosphere containing oxygen, whereas the second dielectric layer 340 is not cured. In an analog capacitor, an RF capacitor, or a high-voltage capacitor, a dielectric layer such as $Al_2O_3$ may be applied between the first electrode 310 and first dielectric layer 320, and the dielectric layer such as $Al_2O_3$ may be inserted under the second electrode 350 in order to ensure suitable electrical properties.

Figure 3:
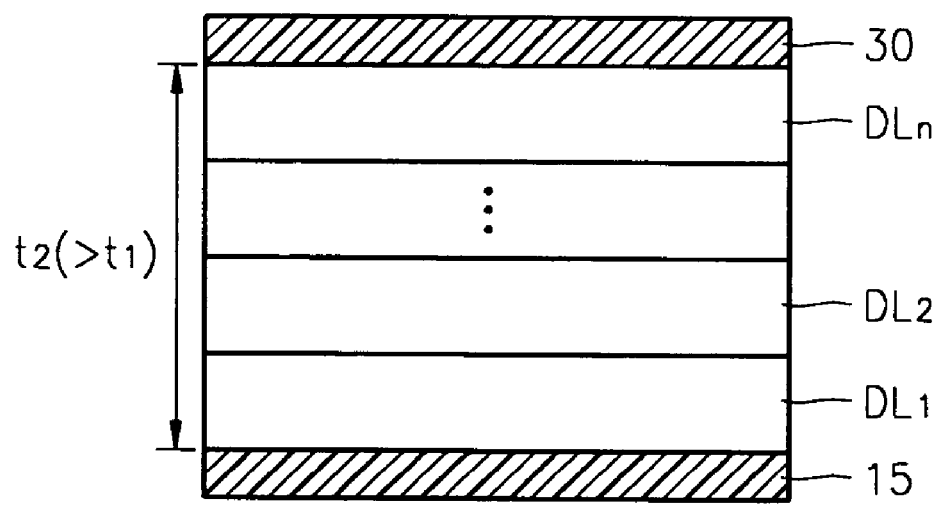
FIG. 3 is a cross-sectional view of a conventional capacitor according to the method of FIG. 1 for applying, for example, to an analog capacitor, a RF capacitor, or a high-voltage capacitor.
Figure 4:
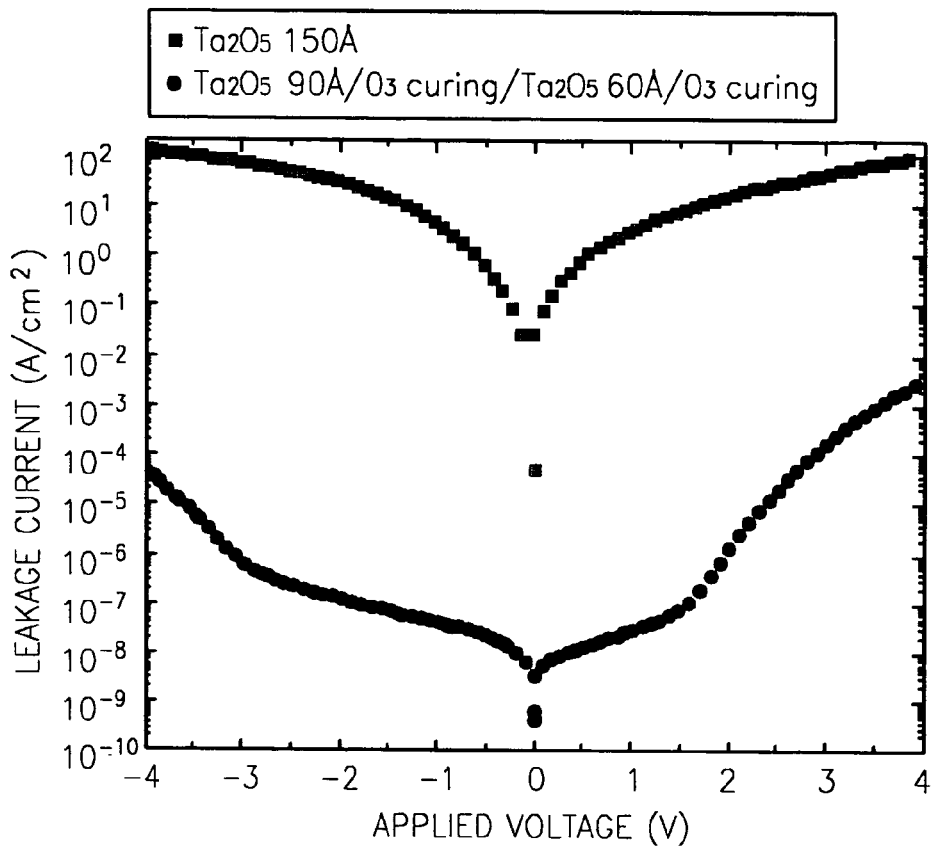
FIG. 4 is a graph showing the results of forming a $Ta_2O_5$ layer by performing dual deposition and curing processes, for applying to the conventional stand-alone memory or embedded memory.

As shown in FIG. 3, in the conventional method, n (n≧3) dielectric layers ($DL_1$, $DL_2$, . . . , and $DL_n$) were deposited and n curing processes were performed to obtain the thickness $t_2$ of the dielectric layer. However, in the present embodiment, the entire thickness $T_2$ (i.e., the thickness $DT_1$ of the first dielectric layer+the thickness $DT_2$ of the second dielectric layer), which is equivalent to the thickness $t_2$ of FIG. 3, can be ensured by properly controlling the respective thicknesses $DT_1$ and $DT_2$ of the first and second dielectric layers 320 and 340, without adding any additional deposition and curing processes.

As a result, the thick dielectric layer required by the analog capacitor, the RF capacitor, or the high-voltage capacitor can be deposited, thus enabling the process simplification.

EXAMPLE OF EXPERIMENT

Figure 10:
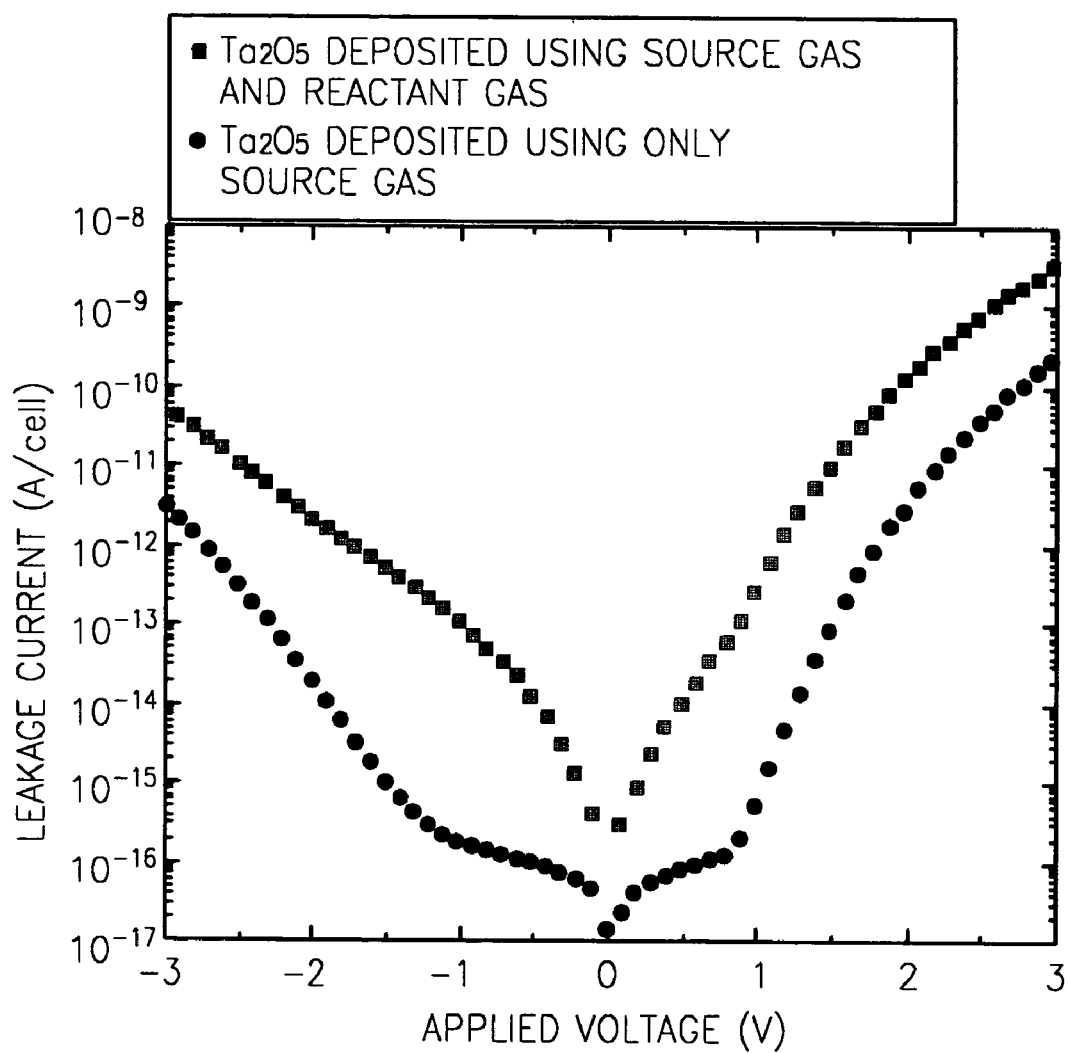
FIGS. 10, 11, and 12 are graphs showing the results of depositing a dielectric layer using only a source gas, as in the method of FIG. 5.

Typically, a CVD process uses a source gas together with a reactant gas to cause a reaction. FIG. 10 is a graph illustrating the results of depositing a dielectric layer using only a source gas without a reactant gas when a $Ta_2O_5$ dielectric layer is deposited to a thickness of 150 Å using CVD without any curing process, and a comparison of these results to the result of depositing a dielectric layer using a source gas with a reactant gas.

Squares ■ shown on the graph represent a leakage current density in the case where the dielectric layer was deposited using a PET source gas and an $O_2$ reactant gas. Circles ● on the graph represent a leakage current density in the case where the dielectric layer was deposited using only a PET source gas. In both cases, a cylinder-type capacitor, which includes electrodes formed of TiN using metal organic CVD (MOCVD), was formed as shown in FIG. 8.

In general, it is assumed that a capacitor formed using a reactant gas exhibits improved electrical properties. However, the results of the present experiment demonstrated that a capacitor formed without a reactant gas exhibits far better electrical properties. It can be inferred that in a structure having a small design rule such as DRAM, the reactant gas acted as an inhibitor to formation of the dielectric layer.

Figure 11:
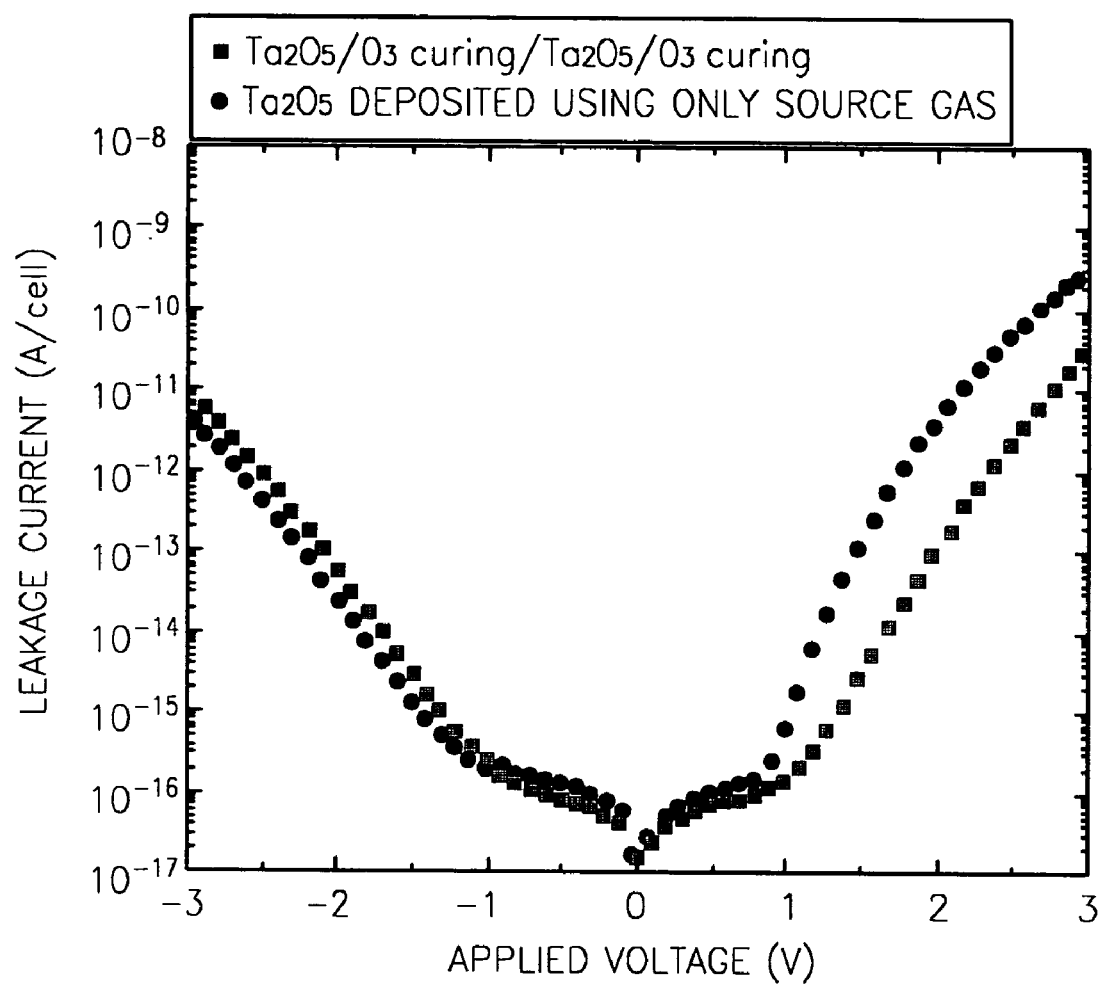

Meanwhile, FIG. 11 shows the resulting electrical properties in the case of the reactant-free deposition of the dielectric layer.

In FIG. 11, squares ■ represent measured leakage current density for a device formed according to the conventional method. That is, TiN deposited by MOCVD was used as device electrodes, and to form a $Ta_2O_5$ layer, a deposition process was performed twice using an $O_2$ reactant gas and a PET source gas, and, following each deposition process, a curing process was performed, using $O_3$. The first $Ta_2O_5$ layer had a thickness of 60 Å and a second $Ta_2O_5$ layer had a thickness of 90 Å such that the total thickness is 150 Å. Circles ● represent leakage current density in the case where TiN deposited by MOCVD was used as electrodes and a $Ta_2O_5$ layer was deposited to a thickness of 150 Å using only a PET source gas. Here, no curing process is performed.

As shown in FIG. 11, when the dielectric layer is formed by reactant-free deposition, though a curing process is not performed, the leakage current caused by a negative applied voltage is substantially equal to that of the conventional method, and the leakage current caused by a positive applied voltage is slightly degraded, thus resulting in excellent electrical properties. Because the leakage current caused by the positive applied voltage affects the initial dielectric layer, as long as the first dielectric layer of the present invention is properly cured, equivalent or better electrical properties can be obtained, as compared with the conventional method.

Figure 12:
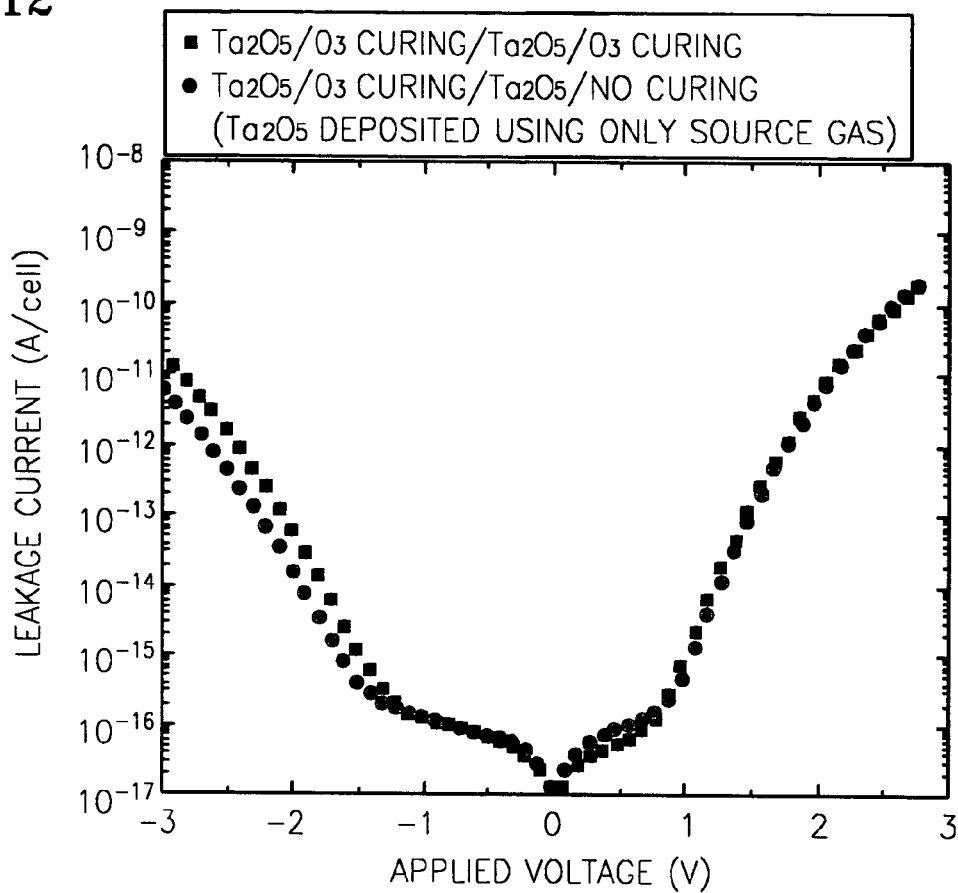

In FIG. 12, squares ■ represent measured leakage current density for a device formed according to the conventional method. That is, TiN deposited by PVD was used as device electrodes, and to form a $Ta_2O_5$ layer, a deposition process was performed twice using an $O_2$ reactant gas and a PET source gas, and, following each deposition process, a curing process was performed using $O_3$. The first $Ta_2O_5$ layer had a thickness of 60 Å and the second $Ta_2O_5$ layer had a thickness of 90 Å such that the total thickness was 150 Å. Circles ● represent leakage current density in the case where a first $Ta_2O_5$ layer was deposited to a thickness of 60 Å using only a PET source gas and is then cured using $O_3$, and a second $Ta_2O_5$ layer was deposited thereon to a thickness of 90 Å using only a PET source gas without a curing process. Though the second $Ta_2O_5$ layer was not cured, the leakage current density was reduced, as compared to the example of FIG. 11.

Embodiment 4

Figure 13:
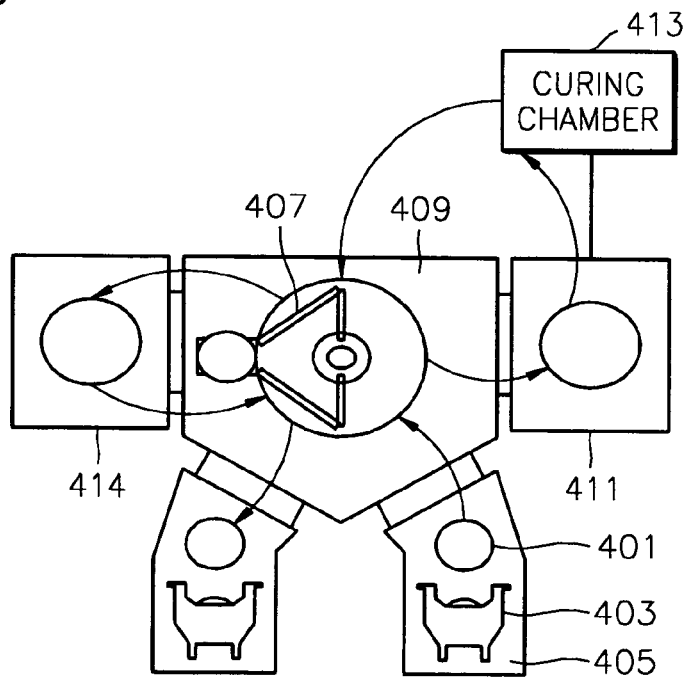
FIG. 13 is a schematic top plan view of an apparatus for forming a dielectric layer according to the embodiments of the present invention.

FIG. 13 is a schematic top plan view of an apparatus for forming the dielectric layer according to the present invention.

Specifically, referring to FIG. 13, the apparatus for forming the dielectric layer comprises a loadlock chamber 405 where a cassette 403, on which semiconductor substrates 401 are loaded, is positioned, a transfer chamber 409 having a unit connected to the loadlock chamber 405 which is capable of loading/unloading a semiconductor substrate 401, for example, a robot arm 407, a first deposition chamber 411 connected to the transfer chamber 409, and a curing chamber 413 connected to the first deposition chamber 411. For example, the curing chamber 413 may be connected to an ozone generator or a plasma generator for generating oxygen radicals. The apparatus further comprises a second deposition chamber 414 connected to the transfer chamber 409.

In FIG. 13, the arrows indicate the manner in which the apparatus in forming a dielectric layer. To begin with, the semiconductor substrate 401, where the first electrode is formed, is introduced into the first deposition chamber 411 by the robot arm 407 in Step S10 of FIG. 5. Thus, a first dielectric layer is deposited as shown in Step S20 of FIG. 5. Here, the first dielectric layer is preferably deposited using only a source gas without a reactant gas. Next, the semiconductor substrate 401 is moved into the curing chamber 413 and is cured in an atmosphere containing oxygen, i.e., using one of $O_3$, $O_2$, $O_2$ plasma, $N_2O$ plasma, and a combination thereof, according to Step S30 of FIG. 5. Then, the semiconductor substrate 401 is introduced into the second deposition chamber 414. A second dielectric layer is deposited to the remaining thickness on the semiconductor substrate 401 using only a source gas without a reactant gas, according to Step S40 of FIG. 5. The semiconductor substrate 401 is then unloaded to the loadlock chamber 405 without additional curing. Subsequently, a second electrode is formed on the second dielectric layer as shown in Step S50 of FIG. 5. Therefore, according to the present invention, steps from depositing the first dielectric layer to depositing the second dielectric layer can be performed by the use of a single apparatus for forming dielectric layers.

While the conventional apparatus requires two or more deposition chambers and curing chambers, the apparatus of the present invention includes only a pair of deposition chambers and a single curing chamber. That is, the structure of the equipment is relatively simple, as compared to the conventional approach. Also, the time required for moving a semiconductor substrate to respective chambers can be shortened, thus reducing the manufacturing costs. Further, because a transfer chamber is shared, the apparatus price is reduced and the space of a clean room can be efficiently used.

While the present invention has been particularly shown and described with reference to preferred embodiments thereof, it will be understood by those of ordinary skill in the art that various changes in form and details may be made therein without departing from the spirit and scope of the present invention as defined by the following claims.

In particular, though a first dielectric layer of the present invention is preferably deposited using only a source gas without a reactant gas, it is also possible to deposit the first dielectric layer using both the source gas and the reactant gas. However, the second dielectric layer should be deposited using only a source gas without a reactant gas.

What is claimed is:

1. A method of manufacturing a capacitor of a semiconductor device, the method comprising:
    forming a first electrode on a semiconductor substrate;
    depositing a first dielectric layer on the first electrode;
    curing the first dielectric layer in an atmosphere containing oxygen;
    depositing a second dielectric layer on the cured first dielectric layer using only a source gas without a reactant gas, wherein depositing the second dielectric layer includes introducing the semiconductor substrate into a deposition chamber, supplying only a source gas without a reactant gas to the deposition chamber and heating the semiconductor substrate such that a stable dielectric layer is deposited; and
    after depositing the second dielectric layer, forming a second electrode on the second dielectric layer without curing the second dielectric layer prior to or during the formation of the second electrode.

2. The method as claimed in claim 1, wherein the first dielectric layer is deposited using only a source gas without a reactant gas.

3. The method as claimed in claim 1, wherein the first dielectric layer and the second dielectric layer are deposited using chemical vapor deposition.

4. The method as claimed in claim 1, wherein the first dielectric layer and the second dielectric layer are deposited using atomic layer deposition.

5. The method as claimed in claim 1, wherein the source gas includes oxygen atoms.

6. The method as claimed in claim 1, wherein the first dielectric layer and the second dielectric layer are deposited at a temperature of 100 to 600° C.

7. The method as claimed in claim 1, wherein the first dielectric layer is deposited to a thickness of 5 to 200 Å, and the second dielectric layer is deposited to a thickness of 5 to 3000 Å.

8. The method as claimed in claim 1, wherein the source gas is one of $Ta(OC_2H_5)_5$, tetra ethoxide tantalum-dimethyl amine ethoxide, $Ta(OsBu)_5$, $Ta(OC_2H_5)_4(acacC_2H_5)$, $TaCl_2(OC_2H_5)_2C_5H_7O_2$, and $Ta(OCH_3)_5$.

9. The method as claimed in claim 1, wherein the first dielectric layer is formed of $Ta_2O_5$ using chemical vapor deposition.

10. The method as claimed in claim 1, wherein the second dielectric layer is formed of $Ta_2O_5$ using chemical vapor deposition.

11. The method as claimed in claim 1, wherein steps from depositing the first dielectric layer to depositing the second dielectric layer are performed in-situ in a single apparatus for forming dielectric layers.

12. The method as claimed in claim 1, wherein the atmosphere containing oxygen is an oxidative atmosphere containing $O_2$ or $O_3$.

13. The method as claimed in claim 1, wherein the atmosphere containing oxygen is electron cyclotron resonance or an RF plasma of one of $O_2$ and $N_2O$.

14. The method as claimed in claim 1, wherein the first electrode and the second electrode are formed of one of TiN, TaN, W, WN, Al, Cu, Ru, $RuO_2$, Pt, Ir, $IrO_2$, a doped polysilicon, and a combination thereof.

15. The method as claimed in claim 1, wherein the first dielectric layer and the second dielectric layer are formed of one of $Ta_2O_5$, $HfO_2$, $ZrO_2$, $Al_2O_3$, $TiO_2$, and a combination thereof.

16. A method of manufacturing a capacitor of a semiconductor device, the method comprising:

forming a first electrode on a semiconductor substrate;

depositing a first $Ta_2O_5$ layer on the first electrode;

curing the first $Ta_2O_5$ layer in an $O_3$ atmosphere;

depositing a second $Ta_2O_5$ layer on the cured first $Ta_2O_5$ layer using only $Ta(OC_2H_5)_5$ without a reactant gas, wherein depositing the second $Ta_2O_5$ layer includes introducing the semiconductor substrate into a deposition chamber, supplying only a source gas without a reactant gas to the deposition chamber and heating the semiconductor substrate such that a stable $Ta_2O_5$ layer is deposited; and after depositing the second $Ta_2O_5$ layer, forming a second electrode on the second $Ta_2O_5$ layer without curing the second $Ta_2O_5$ layer prior to or during the formation of the second electrode.

17. The method as claimed in claim 16, wherein the first $Ta_2O_5$ layer is deposited using only $Ta(OC_2H_5)_5$ without a reactant gas.

18. The method as claimed in claim 16, wherein the first $Ta_2O_5$ layer and the second $Ta_2O_5$ layer are deposited using chemical vapor deposition.

* * * * *